United States Patent [19]

Akiyama et al.

[11] Patent Number: 5,055,895

[45] Date of Patent: Oct. 8, 1991

[54] DOUBLE-DIFFUSED METAL-OXIDE SEMICONDUCTOR FIELD EFFECT TRANSISTOR DEVICE

[75] Inventors: Sigeo Akiyama, Neyagawa; Masahiko Suzumura, Ibaragi; Takeshi Nobe, Hirakata, all of Japan

[73] Assignee: Matsushuta Electric Works, Ltd., Osaka, Japan

[21] Appl. No.: 433,976

[22] Filed: Nov. 9, 1989

Related U.S. Application Data

[62] Division of Ser. No. 294,787, Jan. 9, 1989, Pat. No. 4,902,630.

[30] Foreign Application Priority Data

Jan. 18, 1988 [JP] Japan .................................. 63-8993

[51] Int. Cl.$^5$ .................... H01L 29/10; H01L 29/78; H01L 27/02
[52] U.S. Cl. ................................ 357/23.4; 357/23.1; 357/47
[58] Field of Search .................. 357/23.4, 23.1, 47, 357/23.12

[56] References Cited

U.S. PATENT DOCUMENTS

| Re. 32,800 | 12/1988 | Han et al. ............................... 437/27 |
| 3,461,360 | 8/1969 | Barson et al. ........................ 317/235 |
| 3,484,865 | 12/1969 | Nienhuis .............................. 317/235 |
| 3,667,115 | 6/1972 | Barson et al. ......................... 29/571 |
| 4,280,855 | 7/1981 | Bertin et al. .......................... 148/1.5 |
| 4,329,186 | 5/1982 | Kotecha et al. ................ 357/23.4 X |
| 4,376,286 | 3/1983 | Lidow et al. .......................... 357/23 |
| 4,532,534 | 7/1985 | Ford et al. ........................... 357/23.4 |
| 4,626,293 | 12/1986 | Schols .................................... 148/1.5 |
| 4,642,666 | 2/1987 | Lidow et al. ...................... 357/23.4 |
| 4,705,759 | 11/1987 | Lidow et al. .......................... 437/29 |
| 4,810,665 | 3/1989 | Chang et al. ................. 357/23.4 X |
| 4,902,636 | 2/1990 | Akiyama et al. ...................... 437/45 |

FOREIGN PATENT DOCUMENTS 55-50661 4/1980 Japan .
57-42164 3/1982 Japan .
59-231860 12/1984 Japan .
62-150769 7/1987 Japan .
8202981 9/1982 PCT Int'l Appl. .

OTHER PUBLICATIONS

Article: New Channel-Doping Technique for High--Voltage Depletion Mode Power Mosfet's, Ueda et al. (s/86) pp. 311 ∝ 312.
Article:Tradeoff Between Threshold Voltge & Breakdown in High-Voltage Double-Diffused Transistors, M. D. Pocha et al. (11/78) pp. 1325-1327.
Article: Depletion-mode MOSFETS Open a Channel-in Power Switching, M. Alexander et al. (6/1984) pp. 281-285.

Primary Examiner—William Mintel
Assistant Examiner—Roy Potter
Attorney, Agent, or Firm—Burns, Doane, Swecker & Mathis

[57] ABSTRACT

A double-diffused metal-oxide-semiconductor field effect transistor (DMOSFET) device comprising an insulating layer having an opening on the top surface of a semiconductor wafer, channel regions and well regions and source regions formed through two stage deffusions of impurity materials respectively of a different conductivity type from and the same conductivity type as the wafer and carried out through the opening, and further comprising gate, source and drain electrodes which are formed after mashes provided on a surface area where the drain regions and the source electrode regions that are to be connected to the well regions and source regions and a further ion-implantation of an impurity material of the same conductivity type as the wafer into the channel regions, with the threshold voltage controlled to achieve a depletion type. The channel regions are relatively lower in the carrier corcentration than the other parts in the well regions to achieve a high breakdown voltage notwithstanding that the device is of the depletion type.

2 Claims, 2 Drawing Sheets

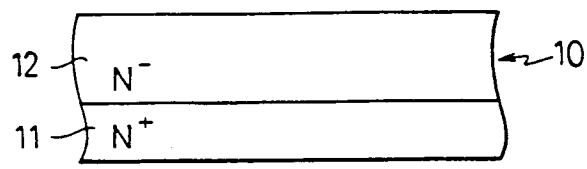
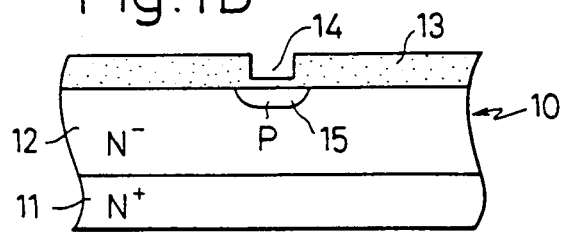
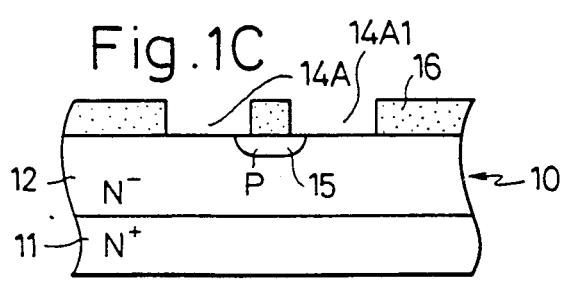
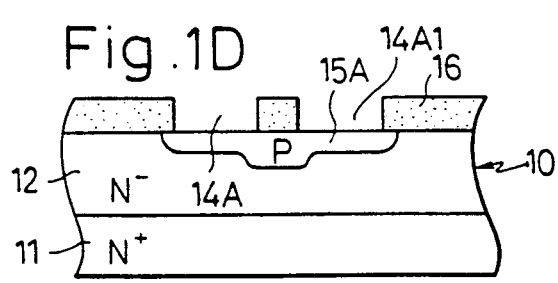
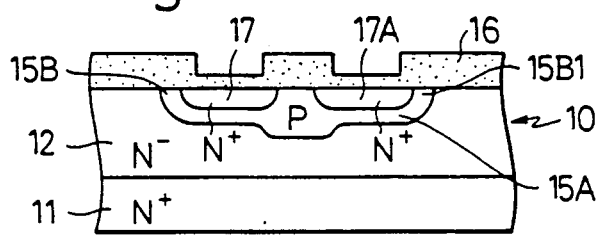
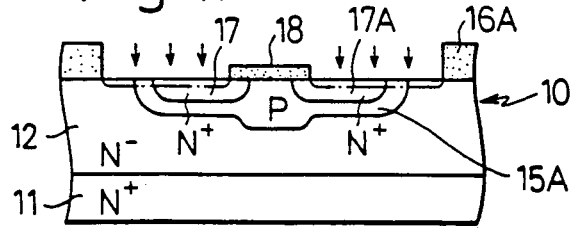

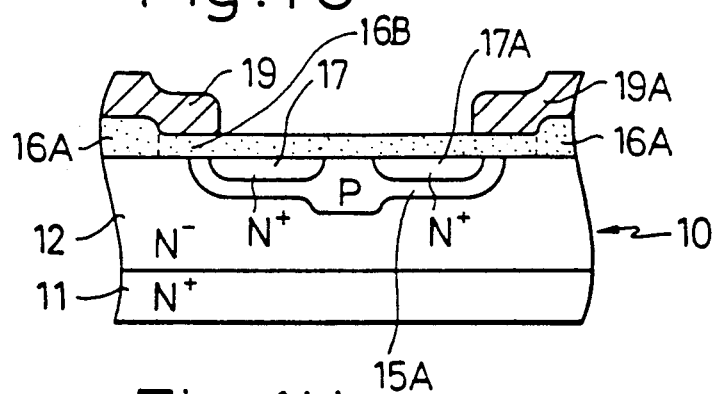
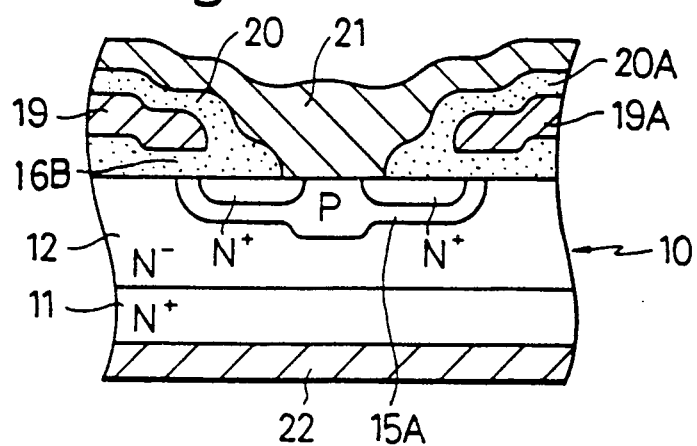
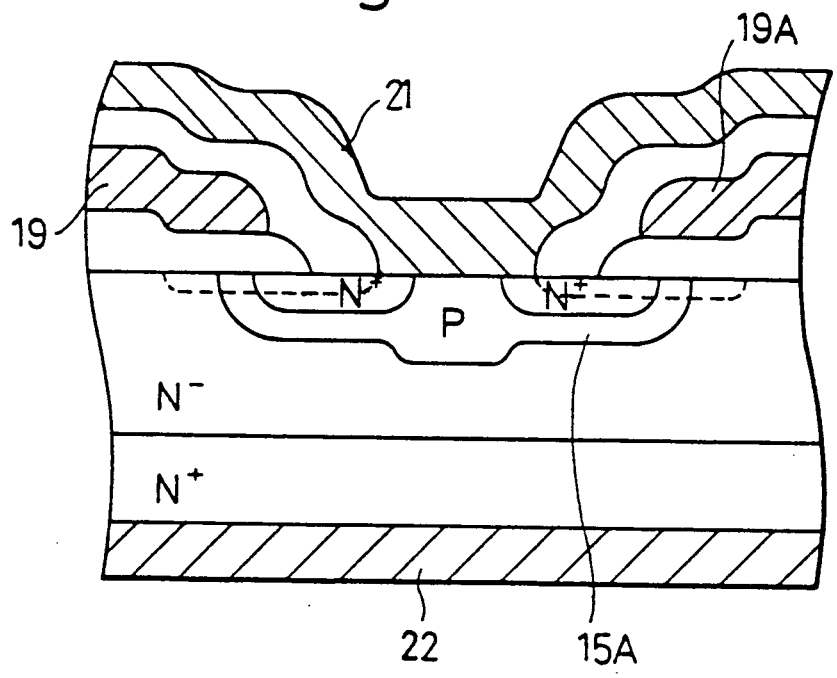

DOUBLE-DIFFUSED METAL-OXIDE SEMICONDUCTOR FIELD EFFECT TRANSISTOR DEVICE

This application is a divisional, of application Ser. No. 07/294,787, filed Jan. 9, 1989 U.S. Pat. No. 4,902,630.

BACKGROUND OF THE INVENTION

This invention relates to a method for manufacturing a power semiconductor device as well as the device thereby manufactured and, more particularly, to a method for manufacturing a power double-diffused metal-oxide semiconductor field effect transistor device and to such semiconductor device.

The semiconductor device, in particular, the double-diffused metal-oxide semiconductor field effect transistor (which shall be hereinafter referred to as "DMOSFET") can be effectively utilized where the transistor is required to be high in the durability, switching speed and noise resisting property.

Further, the DMOSFET is advantageous in that, because of its structure, the current density is high and the ON resistance is low as compared with MOSFET which is not of the double-diffused type. On the other hand, the DMOSFET has been enhancement type, that is, normally-off type, and it has been demanded that, a power MOSFET of depletion type, that is, normally-on type is provided for a use under certain conditions.

DISCLOSURE OF PRIOR ART

Generally, the DMOSFET is enumerated as one of power MOSFET. In, for example, U.S. Pat. No. 3,461,360 to F. Barson et.al., a basic structure of the DMOSFET, wherein a cup-shaped region of one conductivity type and formed between two opposite conductivity type regions is utilized. In the case of this Barson et.al., the cup-shaped one conductivity type region is formed to oppose an opening made in an insulating layer on a surface of a semiconductor wafer. Here, it is made possible to realize a vertical type DMOSFET by forming either a drain or a source electrode as shown in, for example, U.S. Pat. No. 3,484,865 R. J. Nienhuis on reverse surface of the wafer as in the above. For manufacturing method of the vertical type DMOSFET, there have been disclosed various methods for manufacturing the relevant transistors of the enhancement type (normally-off type) in, for example, U.S. Pats. Nos. 4,376,286, 4,642,666 and 4,705,759 to A. Lidow et.al.

In U.S. Pat. No. 3,667,115 to F. Barson et.al., on the other hand, there has been disclosed a method for forming a DMOSFET of the depletion type (normally-on type), in which method a cup-shaped region of first conductivity type enclosed by two regions of second conductivity type, by forming an insulating layer on a surface of a semiconductor wafer of the second conductivity type, forming an opening in this insulating layer, and diffusing through this opening into the wafer an impurity of the first conductivity type and an impurity of the second conductivity type, and a surface of this cup-shaped first conductivity type region is made to be a channel region. Thereafter, a surface layer of the second conductivity type semiconductor wafer is oxidized to have the impurity material of second conductivity type piled up at the surface of the wafer, and the impurity material of first conductivity type is absorbed in the oxidized surface layer, upon which the channel region of normally ON type is to be formed between the two second conductivity type regions In forming the DMOSFET, such redistribution of the impurities by the oxidation as in the above is largely dependent on the atmosphere and oxidizing time for forming the oxidized layer and is variable also depending on the concentration and type of the impurities. There arises, therefore, a drawback in carrying out the method while controlling accurately the threshold voltage of the DMOSFET. Further, this known method has been also defective in that the process reproducibility is low and the process freedom is limited.

In U.S. Pat. No. 4,626,293 to G. Schols, further, there has been disclosed a process for manufacturing a DMOSFET using a polysilicon gate material as a mask, according to which a surface of a semiconductor wafer of first conductivity type is covered with an oxidized layer, and a polysilicon is formed on this oxidized layer. An opening is thereafter made through the polysilicon and the oxidized layer, an impurity material of second conductivity type is injected through the opening to carry out a first diffusion. An impurity material of first conductivity type is injected also through the opening to carry out a second diffusion into the wafer, so that a channel region of second conductivity type will be formed under the polysilicon. When the depletion type DMOSFET is to be manufactured according to this process, injection amount of the impurity material of second conductivity type is decreased, and the carrier concentration at the surface of the second conductivity zone forming the channel region is made lower so as to lower the threshold voltage. Since this threshold voltage is determined by the injection amount of the impurity material of second conductivity type, it will be possible that the process reproducibility and the freedom will be compensated for.

With the foregoing arrangements, however, not only the surface carrier concentration of the second conductivity zone forming the channel region but also the carrier concentration of the entire second conductivity zone will be lowered, so as to cause a problem to arise in that a so-called "punch through" is likely to occur between the source and the drain so as to lower the breakdown voltage characteristics.

SUMMARY AND OBJECT OF THE INVENTION

A primary object of the present invention is, therefore, to provide a method for manufacturing a depletion type DMOSFET which is easy to control and set the threshold voltage, high in the process reproducibility and freedom, and shows high breakdown voltage characteristics.

According to the present invention, the above object of the invention can be attained by providing a depletion type DMOSFET device comprising a silicon wafer including a reverse side zone doped in a high impurity concentration and a top side zone doped in a low impurity concentration, a diffusion region formed in surface area of said top side zone of said wager through two stage diffusions of impurity materials and including thus well regions of a different conductivity type from the wafer and source regions of the same conductivity type as the wafer, an insulating layer provided on said top side zone except for central area of said diffusion regions, on the wafer being made thicker than that on the well regions, channel regions defined in top surface area of said well regions and between said source regions and said top side zone which forming drain regions, said channel regions being relatively lower in the carrier concentration than other parts in the well regions, gate electrodes formed above said channel regions with gate oxide layers interposed, source electrodes provided on said well regions and source regions, and a drain electrode provided on said reverse side high impurity concentration zone of the wafer.

With the above method, it is made possible to render the carrier concentration in surface area of the zone of a conductivity forming the channel regions to be relatively low for controlling the threshold voltage to be low, while rendering the carrier concentration in other area to be high for reducing the punch-through occurrence, to allow the device to be high in the breakdown voltage. In the case of, for example, N-channel DMOSFET, it is made possible to perform a low voltage driving with such a low threshold voltage as $-1.5$ to $-3.5V$, while it is made possible to obtain, in particular, a depletion type DMOSFET with the breakdown voltage and current density as the DMOSFET characteristics maintained to be high.

Other objects and advantages of the present invention shall be made clear in following description of the invention detailed with reference to a preferred embodiment shown in accompanying drawings.

BRIEF EXPLANATION OF THE DRAWINGS

FIGS. 1A through 1H are diagrams showing the sequence of manufacturing steps of the depletion type DMOSFET according to the present invention; and FIG. 2 is a cross-sectional view at a main part of the depletion type DMOSFET obtained through the steps of FIG. 1.

It should be appreciated that, while the present invention shall be explained with reference to the embodiment shown in the accompanying drawings, the intention is not to limit the invention only to this embodiment but rather to include all modifications, alterations and equivalent arrangements possible within the scope of appended claims.

DISCLOSURE OF PREFERRED EMBODIMENT

Referring to FIGS. 1A through 1H, there is shown a method for manufacturing an N-channel DMOSFET of the depletion type, in which the breakdown voltage characteristics of the DMOSFET device shall be referred to later, with an assumption that the characteristics will reach 400V.

First, as shown in FIG. 1A, a semiconductor wafer 10 forming a drain region of the device is prepared. Reverse side of this semiconductor wafer 10 is an N+ type zone 11 with a doping at a high impurity concentration, while top surface side is an N− type zone 12 with a doping at a relatively low impurity concentration. The concentration and thickness of this N− type zone 12 are to be properly selected in accordance with the breakdown voltage required for the DMOSFET while the impurity concentration is selected to be about $2 > 10^{14} cm^{-3}$ and the thickness to be about 40 $\mu m$ when the breakdown voltage is 400V. Next, as shown in FIG. 1B, such insulating layer 13 of $SiO_2$ or the like that will act as mask is formed in surface zone of the semiconductor wafer 10. When an oxide layer is formed as the insulating layer 13, its thickness should preferably be more than 5000Å. Further, a known photolithography is carried out with respect to the surface of this insulating layer 13 to form an opening 14, and a diffusion of a P-type impurity with boron employed is carried out through this opening 14 into the zone 12 to form a P-type diffusion region 15. When the impurity injection is carried out by means of an ion-implantation, a dose amount is made to be about $6 \times 10^{14} cm^{-2}$. And covering the opening 14 with oxide layers.

Next, as shown in FIG. 1C, an oxide layer 16 in which further openings 14A and 14A1 for double diffusion are formed is provided on the zone 12 for forming channel regions, P-type impurity with boron is injected and diffused through these further openings 14A and 14A1 into the zone 12, the P-type diffusion region 15 is thereby expanded along the top surface of the wafer 10, and a well region 15A is thereby formed, as seen in FIG. 1D. In the event of the impurity injection for forming the well region 15A is carried out by means of the ion-implantation, its dose amount is made to be about $7.5 \times 10^{13} cm^{-2}$.

Further, as shown in FIG. 1E, an oxide layer 16 is used for mask of injecting and diffusing an N-type impurity with phosphorus into surface zones of the P-type well region 15A, and N-type diffusion zones 17 and 17A (N+ zones) are formed as source regions. Outside the P-type well region 15A, there is present the N− zone 12 as a part of the drain region, so that channel regions 15B and 15B1 will be formed in surface zones of the well region 15A disposed between the both N-type zones 12 and 17, 17A. It will be appreciated in this case that the N-type diffusion zones 17 and 17A are formed inside the well region 15A.

As shown in FIG. 1F, next, the oxide layer 16 is partly removed by means of the photolithography at a part positioned on the P-type well region 15A and its peripheral zone extending at least 5 $\mu m$ from outer peripheral edges of the further openings 14A and 14A1, so as to expose top surfaces of the P-type well region 15A and N-type zones 17 and 17A. Thereafter, a photoresist 18 is provided so as to cover a central area as in the drawing of the well region 15A, and an ion-implantation of such N-type impurity as phosphorus P, arsenic As or the like is carried out with the now provided photoresist 18 and remaining parts 16A of the oxide layer 16, to areas shown by single-dot chain lines. While the amount of the ion-implantation may be properly selected in accordance with surface concentration of the channel regions 15B and 15B1 or the threshold voltage required for the DMOSFET, it is preferable to set the amount in the case of phosphorus to be about 5 to $25 \times 10^{11} cm^{-2}$. As the N-type impurity is thus ion-implanted into the surface areas of the P-type well region 15A including the channel regions 15B and 15B1, a reverse conductivity impurity is caused to be increased in the channel regions 15B and 15B1, the carrier concentration in the channel regions 15B and 15B1 is decreased by an increased amount of the reverse conductivity impurity, and a normally-on channel is formed. In this case, the N zone 12 as the drain region is reliably protected by the remaining parts 16A of the oxide layer 16 while the central area of the well region 15A is protected by the photoresist 18 so as not to be influenced by the ion-implantation. In practice, the ion-implantation of the N-type impurity is limited only to the surface area, and the impurity diffusion treatment as a main part of heat treatment has already been completed, so that the N-type impurity will never be diffused exceedingly over a desired range but as retained to be at the channel regions 15B and 15B1, whereby the carrier concentration at other area of the channel regions 15B and 15B1 in the P-type well region 15A is not caused to vary. Further, as the surface area of the N- zone 12 forming part of the drain region below the remaining parts 16A of the oxide layer 16 and the central area of the well region 15A below the photoresist 18 are not affected by the ion-implantation, any variation in the breakdown voltage value of the DMOSFET or any occurrence in MOS diode of parasitic series resistance component will not take place. Accordingly, it becomes possible to freely adjust the threshold voltage in a considerably wide range by means of the carrier concentration of the channel regions 15B and 15Bl with the injection amount of the N-type impurity optionally selected.

As shown in FIG. 1G, further, the photoresist 18 is removed, thereby exposed diffusion region 15 is covered by a gate oxide layer 16B formed through any known gate oxide-layer forming process, and gate electrodes 19 and 19A are formed on the remaining oxide layer parts 16A and at least partly on the gate oxide layer 16B disposed on the channel regions 15B and 15Bl. In the present instance, the remaining oxide layer parts 16A is made to be about 8000Å and the gate oxide layer 16B to be about 1000Å, while the gate electrodes 19 and 19A are made to be about 5000Å thick by means of a polysilicon doped N-type.

Finally, as shown in FIG 1H, insulating layers 20A are formed on the gate electrodes 19 and 19A, a part of the gate oxide layer 16B positioned on the central area of the diffusion region 15 is removed, a source electrode 21 is formed on the central area of the diffusion region 15, and a drain electrode 22 is formed on reverse surface on the side of the N+ zone 11 of the semiconductor wafer 10 whereby such depletion type DMOSFET as shown in FIG. 2 as magnified is completed. In this DMOSFET, the remaining oxide layer parts 16A disposed on the surface of the N− zone 12 forming a part of the drain region are formed to be thicker than the gate oxide layer 16B, so that any parasitic capacity between the gate and drain, that is, feedback capacity can be made small. For the gate oxide layer 16B on the channel regions 15B and 15Bl, its thickness should preferably not exceed 1000Å so that the gate action by means of the gate electrodes 19 and 19A will be realized with the gate oxide layer 16B interposed, while other parts of the layer 16B may be formed thicker. It should be clear that, in FIG. 2, zones defined by dotted lines are the ion-implanted zones.

While the foregoing embodiment refers to the DMOSFET of a vertical type as an example, it should be readily appreciated that the present invention is similarly applicable to any DMOSFET of lateral type, or of a conductivity modulation type, and can be used not only in the transistor but also in thyristor. Further, the semiconductor device may be of a different structure in which the N-type and P-type zones are respectively reversed.

What is claimed is:

1. A depletion type DMOSFET device comprising a silicon wafer including a reverse size zone having a high impurity concentration and a top side zone having a low impurity concentration, a diffusion region in a surface area of said top side zone of said wager including well regions of a different conductivity type from the wager and source regions of the same conductivity type as the wafer, an insulating layer on said top size zone except for central area of said diffusion regions, said insulating layer outside said well regions on the wafer being thicker than that on the well regions, channel regions in a top surface area of said well regions and between said source regions and said top side zone, said channel regions being relatively lower in the carrier concentration than other parts in the well regions, gate electrodes above said channel regions with gate oxide layers interposed between said gate electrodes and said channel regions, source electrodes on said well regions and source regions, and a drain electrode on said reverse side high impurity concentration zone of the wafer.

2. A depletion type DMOSFET device comprising:
 a silicon wafer including a first layer of high impurity concentration and a second layer, formed in an adjacent parallel plane, with a low impurity concentration;
 a diffusion region in a surface area of said second layer of said wafer including well regions of a conductivity type different from said wafer and source regions of the same conductivity type as said wafer;
 an insulating layer provided on a side of said second layer opposite to said first layer, said insulating layer omitted at a central area of said diffusion region, and being thicker outside said well regions than on the well regions;
 channel regions defined in said second layer adjacent said well regions and between said source regions, said channel regions being relatively lower in carrier concentration than other parts of said well regions;
 gate electrodes formed above said channel regions with gate oxide layers interposed between said gate electrodes and said channel regions;
 source electrodes provided on said well regions and source regions; and
 a drain electrode provided on a side of said first layer opposite to said second layer of said wafer.

* * * * *